(12) United States Patent
Sekigawa et al.

(10) Patent No.: US 7,486,383 B2
(45) Date of Patent: Feb. 3, 2009

(54) DIRECT EXPOSURE APPARATUS AND DIRECT EXPOSURE METHOD

(75) Inventors: Kazunari Sekigawa, Nagano (JP); Hiroaki Samizu, Nagano (JP); Takahiro Inoue, Nagano (JP)

(73) Assignee: Shinko Electric Industries Co., Ltd., Tokyo (JP)

( * ) Notice: Subject to any disclaimer, the term of this patent is extended or adjusted under 35 U.S.C. 154(b) by 429 days.

(21) Appl. No.: 11/291,658

(22) Filed: Nov. 30, 2005

(65) Prior Publication Data

US 2006/0114440 A1   Jun. 1, 2006

(30) Foreign Application Priority Data

Nov. 30, 2004  (JP) .............................. 2004-346212
Feb. 24, 2005  (JP) .............................. 2005-048945

(51) Int. Cl.
G03B 27/54  (2006.01)
G03B 27/72  (2006.01)

(52) U.S. Cl. ...................................................... 355/69

(58) Field of Classification Search ............. 355/67–70; 378/34, 35; 430/30, 322; 250/548
See application file for complete search history.

(56) References Cited

U.S. PATENT DOCUMENTS 7,084,977 B2 *  8/2006  Nomura ....................... 356/364

FOREIGN PATENT DOCUMENTS

JP     10-112579      4/1998
JP     2002-367900   12/2002

* cited by examiner

Primary Examiner—Della J. Rutledge
(74) Attorney, Agent, or Firm—Morgan & Finnegan, LLP

(57) ABSTRACT

A direct exposure apparatus having a light source for projecting light onto an exposure target or, more specifically, an exposure target substrate, comprises: measuring means for measuring the illuminance distribution of light on an area corresponding to the exposure surface of the exposure target substrate; and control means for controlling, based on the measurement result supplied from the measuring means, the light source so that the intended illuminance distribution can be obtained.

14 Claims, 16 Drawing Sheets

MOVING DIRECTION OF SUBSTRATE

MOVING DIRECTION OF SUBSTRATE

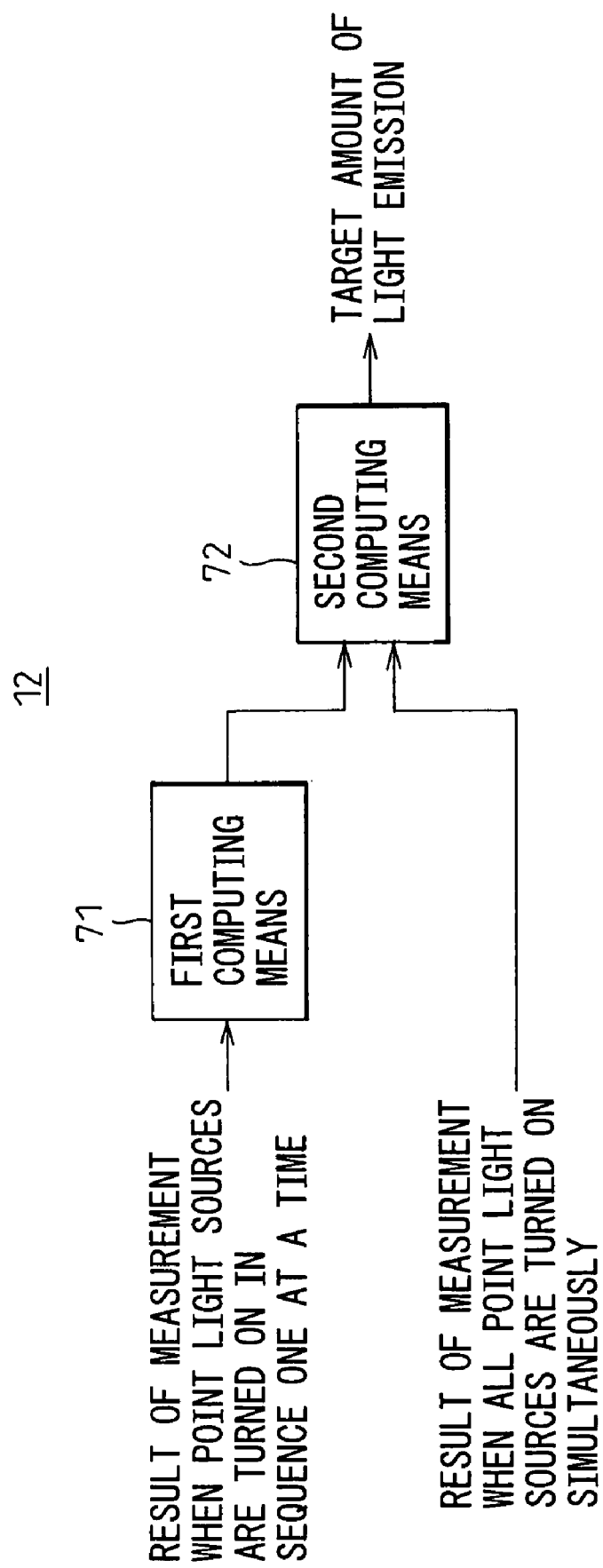

FIG.11

TABLE

|  | SENSOR ELEMENT $S_1$ | SENSOR ELEMENT $S_2$ |
|---|---|---|
| LIGHT SOURCE $D_1$ | 10 | 5 |
| LIGHT SOURCE $D_2$ | 8 | 7 |
| LIGHT SOURCE $D_3$ | 4 | 11 |

DIRECT EXPOSURE APPARATUS AND DIRECT EXPOSURE METHOD

BACKGROUND OF THE INVENTION

1. Field of the Invention

The present invention relates to a direct exposure apparatus having a light source for projecting light onto an exposure target or, more specifically, an exposure target substrate, and a direct exposure method for exposing the exposure target substrate by projecting light from the light source onto the exposure target substrate.

2. Description of the Related Art

Generally, a wiring pattern on a wiring substrate is formed by exposing the substrate based on design data defining the wiring pattern and by developing and printing the desired pattern on the substrate, followed by etching. In one exposure method as an example, the exposure is performed using a photomask. In this method, a photosensitive resin is applied over a substrate fabricated by bonding metal foil as a conductive layer onto an insulating material, and a photomask with the desired wiring pattern written thereon is placed over it. By exposing the thus prepared substrate, the wiring pattern of the photomask is transferred to the photosensitive resin on the substrate. Thereafter, by performing the steps of developing, etching, plating, etc., the metal foil on the substrate is formed as the desired wiring pattern.

In the exposure method using such a photomask, the photomask is placed in intimate contact with the substrate prior to exposure; if, at this time, any foreign matter or stain is left adhering to the substrate, the shape of the foreign matter or stain is also transferred onto the substrate. The finer the wiring pattern on the substrate is, the more sensitive the photomask is to foreign matter and stains and, therefore, particularly strict management of the photomask is required. Further, if the wiring pattern is changed or damaged, a new photomask must be produced. Furthermore, the photomask must be produced on a trial basis a number of times by making corrections accounting for the expansion, shrinkage, distortion, displacement, etc. that can occur in the substrate. The resulting increase in production cost and time imposes a greater burden on the fabrication process of the wiring substrate.

On the other hand, a patterning method based on direct exposure that does not use photomasks has been proposed in recent years. According to this method, as corrections for the expansion, shrinkage, distortion, displacement, etc. of the substrate can be made in real time or in advance at the exposure data generation stage, significant improvements can be achieved, for example, in enhancing the production accuracy, increasing the production yield, shortening the delivery time, and reducing the production cost.

As one example of the patterning method based on direct exposure, Japanese Unexamined Patent Publication No. 10-112579 discloses a method that forms an exposure pattern by direct exposure using a Digital Micromirror Device (DMD). FIG. 19 is a diagram illustrating one prior art example of a direct exposure apparatus using the DMD. When directly exposing the resist formed on an exposure target substrate 3 moving relative to the DMD 51, pattern data corresponding to the pattern to be exposed is generated by a pattern generator 52, and this pattern data is input to the DMD 51. The pattern generator 52 operates in conjunction with a position sensor 53 that detects the position of the exposure target substrate 3 moving in relative fashion, and thus the pattern generator 52 generates the pattern data in a manner synchronized to the position of the exposure target substrate 3. A light source 2 projects light onto the DMD 51 through a diffusing plate 54 and a lens 55. The DMD 51 causes each of its tiny mirrors (micromirrors) to tilt according to the pattern data, thereby appropriately changing the direction of the light reflected by each micromirror on the DMD 51 and thus projecting the light through a lens 56 onto the resist on the exposure target substrate 3 to form the exposure pattern corresponding to the pattern data.

In the direct exposure method, the light source for projecting light onto the exposure target substrate must be constructed to provide uniform and evenly distributed light over the entire surface of the exposure target substrate in order to achieve a good exposure result.

FIG. 20 is a diagram showing one prior art example of the light source constructed to provide uniform illumination using a reflecting plate in the direct exposure apparatus. The reflecting plate 57 is placed behind the light source 2, and any unevenness in the light reflected from the reflecting plate 57 as well as in the light emitted directly from the light source 2 is corrected using the diffusing plate 54.

FIG. 21 is a diagram showing one prior art example which uses laser diodes for the light source in order to obtain uniform illumination in the direct exposure apparatus. The light source 2 is constructed by arranging the laser diodes 58 in a two-dimensional array, and the light emitted from the light source is projected onto the diffusing plate 54 to obtain uniform illumination.

Further, as disclosed in Japanese Unexamined Patent Publication No. 2002-367900, there is also proposed a technique that provides uniform illumination over the entire surface of the exposure target substrate by controlling the tilt angle of each micromirror on the DMD based on data concerning the distribution of the amount of image light on the exposure target substrate.

With the above-described approach that uses the reflecting plate in order to provide uniform illumination over the entire surface of the exposure target substrate, it is difficult in practice to produce an ideal surface-area light source because the light source 2 is not an ideal point light source.

FIG. 22 is a diagram showing the intensity distribution of light emission of a laser diode; as shown in FIG. 22, the intensity distribution of the light that a single laser diode emits obeys a Gaussian distribution (normal distribution). FIG. 23 is a diagram schematically illustrating the illuminance distribution of a surface-area light source constructed by arranging laser diodes in a two-dimensional array. In the figure, the darker the area, the lower the intensity of illumination. As the intensity of light emitted from a laser diode obeys a Gaussian distribution, the intensity of light emission decreases exponentially with the distance from the center of the laser diode. Usually, a laser diode is provided with a feedback circuit for controlling the intensity of light emission in order to obtain stable light output. Accordingly, in the case of the surface-area light source constructed by arranging laser diodes in a two-dimensional array, characteristics close to those of surface light emission can be obtained to a certain extent. However, as shown in FIG. 23, the illuminance decreases toward the periphery of the surface-area light source as the contributions from adjacent laser diodes decrease. That is, with the feedback circuit alone that each individual laser diode has, it is not possible to sufficiently control the illuminance distribution of the light obtained from the surface-area light source constructed from a two-dimensional array of laser diodes.

FIG. 24 is a diagram for explaining a technique (a first example) for improving the uniformity of illumination when the surface-area light source is constructed by arranging the laser diodes in a two-dimensional array. According to this technique, in the surface-area light source constructed from a two-dimensional array of laser diodes each having a uniform light output, all the laser diodes are driven to emit light, but the light emitted from the laser diodes (indicated by open circles) located in the peripheral area of the surface-area light source where the contributions from adjacent laser diodes drops is blocked by using a filter or the like (not shown) so that only the light emitted from the laser diodes (indicated by solid circles) located in the center area is used for exposure. This serves to improve the uniformity of illumination, but the efficiency drops as there are many laser diodes that do not contribute to exposure.

FIG. 25 is a diagram for explaining a technique (a second example) for improving the uniformity of illumination when the surface-area light source is constructed by arranging the laser diodes in a two-dimensional array. According to this technique, the surface-area light source is constructed by using laser diodes having different output power levels. More specifically, as shown in FIG. 25, the laser diodes located nearer to the periphery (indicated by solid shading) of the surface-area light source have larger output power, while the laser diodes located nearer to the center (indicated by stippled shading) have smaller output power. With this technique, however, once the surface-area light source has been constructed, it is difficult to make readjustments thereafter; furthermore, it is not possible to flexibly accommodate future changes in exposure conditions, etc.

On the other hand, in the case of the technique disclosed in Japanese Unexamined Patent Publication No. 2002-367900, as the tilt angle of each micromirror is controlled not only according to the amount of light falling on the surface of the exposure target substrate but also according to the pattern data generated for forming the wiring pattern, generation of data for controlling the tilt angles of the micromirrors becomes very complex.

In view of the above problems, it is an object of the present invention to provide a direct exposure apparatus and a direct exposure method wherein provisions are made so that not only can the light to be projected onto an exposure target substrate be controlled to provide the desired illuminance distribution, but also the intended illuminance distribution can be easily obtained even when exposure conditions are changed.

SUMMARY OF THE INVENTION

To achieve the above object, in the direct exposure apparatus according to the present invention, the illuminance distribution of the light projected from the light source onto the exposure target, i.e., the exposure target substrate, is measured and, based on the result of the measurement, the light source is controlled so that the intended illuminance distribution can be obtained.

FIG. 1 is a block diagram showing the basic functional configuration of the direct exposure apparatus according to the present invention. The direct exposure apparatus 1 having a light source 2 for projecting light onto an exposure target or more specifically an exposure target substrate 3, comprises: a measuring means 11 for measuring the illuminance distribution of light on an area corresponding to the exposure surface of the exposure target substrate 3; and a control means 12 for controlling, based on the measurement result supplied from the measuring means 11, the light source 2 so that the intended illuminance distribution can be obtained. The intended illuminance distribution here refers, for example, to a uniform illuminance distribution that does not vary depending on the position.

BRIEF DESCRIPTION OF THE DRAWINGS

The present invention will be more clearly understood from the description as set forth below with reference to the accompanying drawings, wherein:

FIG. 9 is a diagram for explaining the arithmetic processing performed within the control means according to the first embodiment of the present invention;

FIG. 11 shows a table concerning a relationship between the emission levels of point light sources and the illuminance levels measured by the respective sensor elements.

DESCRIPTION OF THE PREFERRED EMBODIMENTS

Figure 2:
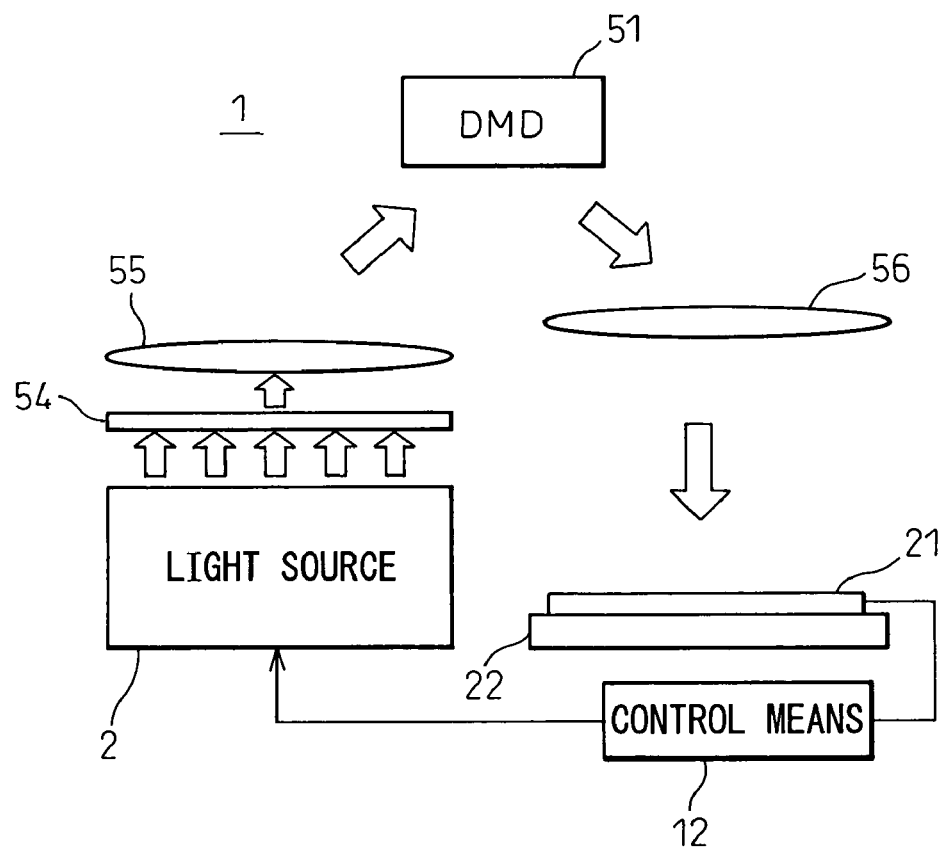
FIG. 2 is a diagram schematically showing the configuration of a direct exposure apparatus according to a first embodiment of the present invention.

FIG. 2 is a diagram schematically showing the configuration of a direct exposure apparatus according to a first embodiment of the present invention.

Figure 1:
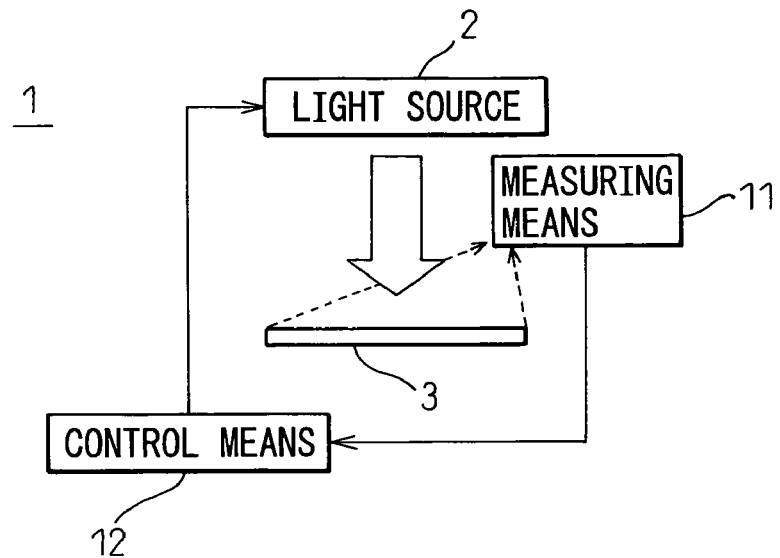
FIG. 1 is a block diagram showing the basic functional configuration of a direct exposure apparatus according to the present invention.
Figure 19:
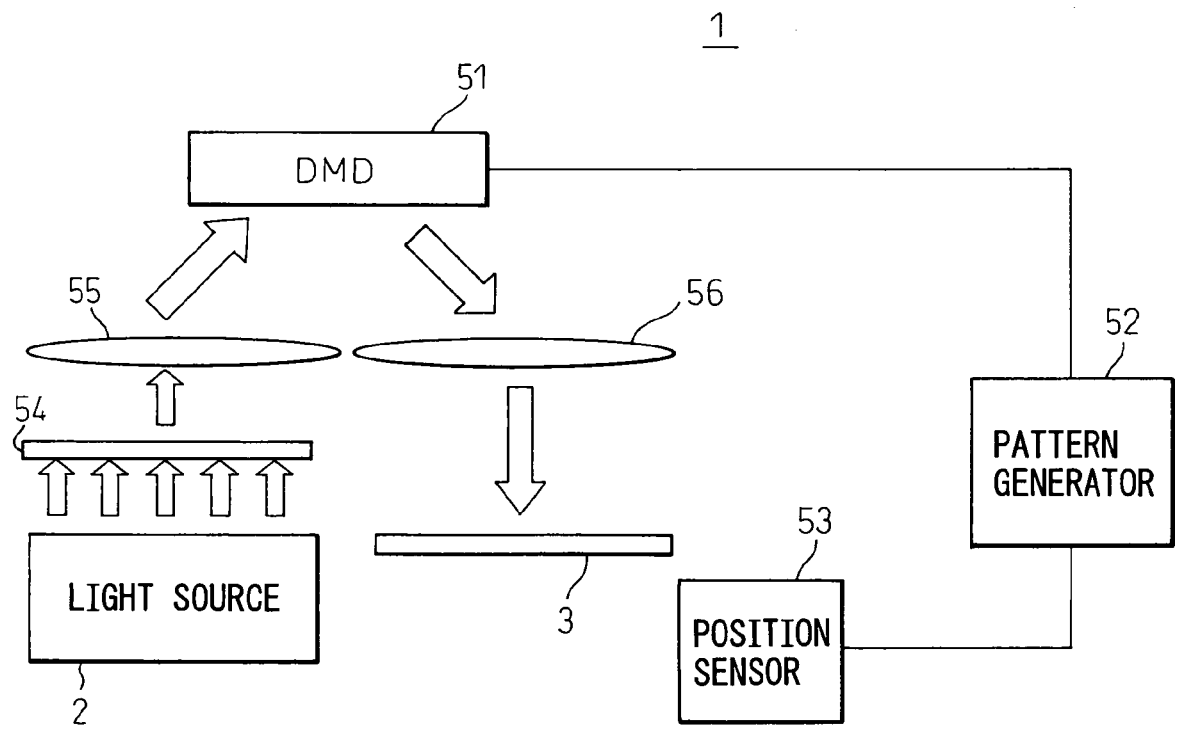
FIG. 19 is a diagram illustrating one prior art example of a direct exposure apparatus that uses a DMD.
Figure 20:
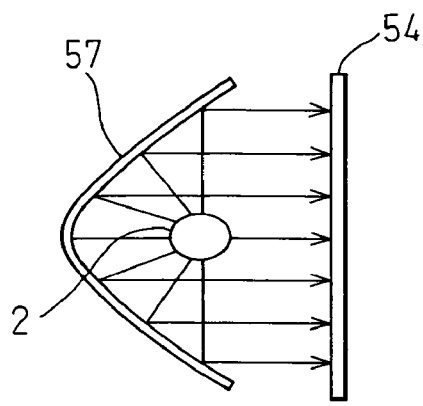
FIG. 20 is a diagram showing one prior art example of a light source constructed to provide uniform illumination using a reflecting plate in the direct exposure apparatus.
Figure 21:
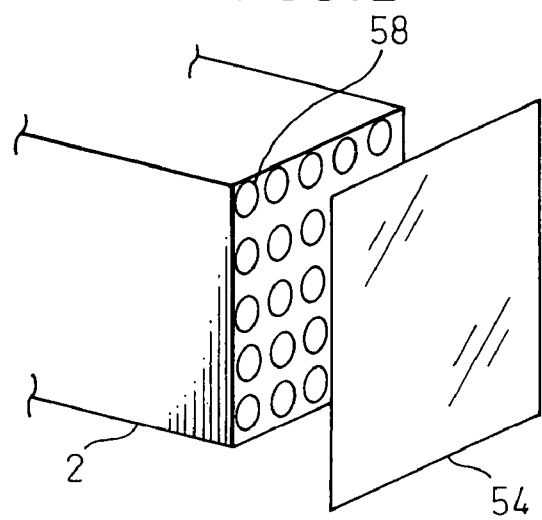
FIG. 21 is a diagram showing one prior art example which uses laser diodes for the light source in order to obtain uniform illumination in the direct exposure apparatus.
Figure 22:
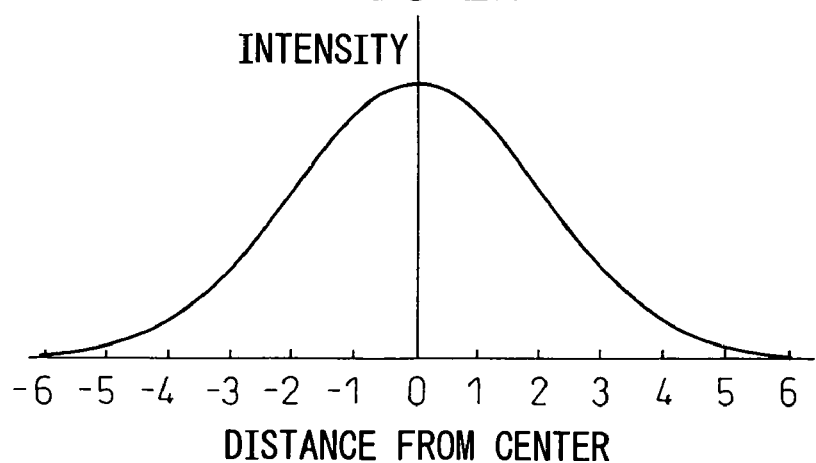
FIG. 22 is a diagram showing the intensity distribution of light emission of a laser diode.
Figure 23:
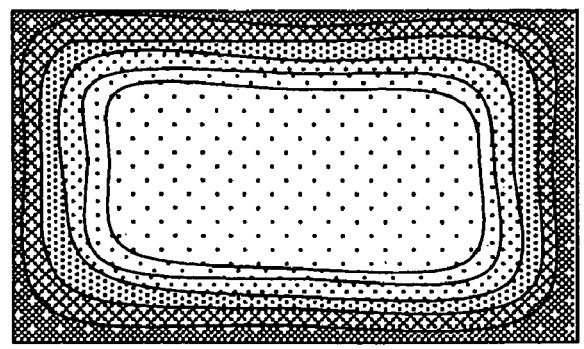
FIG. 23 is a diagram schematically illustrating the illuminance distribution of a surface-area light source constructed by arranging laser diodes in a two-dimensional array.
Figure 24:
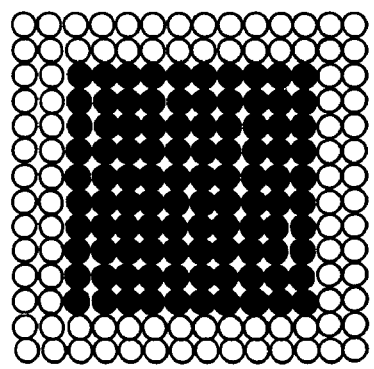
FIG. 24 is a diagram for explaining a technique (a first example) for improving the uniformity of illumination when the surface-area light source is constructed by arranging laser diodes in a two-dimensional array.
Figure 25:
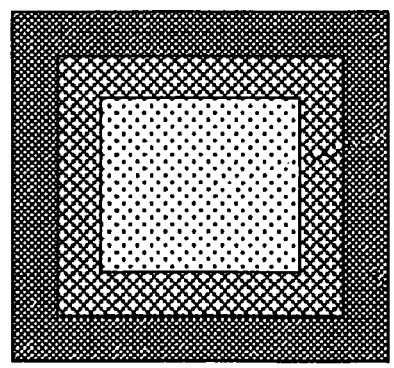
FIG. 25 is a diagram for explaining a technique (a second example) for improving the uniformity of illumination when the surface-area light source is constructed by arranging laser diodes in a two-dimensional array.

The direct exposure apparatus according to this embodiment includes a sensor 21 as the measuring means 11 explained with reference to FIG. 1, which measures the illuminance distribution of light on an exposure surface equivalent to the exposure target substrate before starting the exposure of the exposure target substrate. In the present embodiment, the light source 2 is constructed as a surface-area light source by arranging a plurality of point light sources or more specifically laser diodes (not shown) in a two-dimensional array. The DMD 51, diffusing plate 54, and lenses 55 and 56 are the same as those described with reference to FIG. 19. Reference numeral 22 indicates a stage on which the exposure target substrate is mounted for direct exposure. In FIG. 2, the position sensor and the pattern generator are omitted.

In the present embodiment, the sensor 21 is placed so that the detecting part (for example, imaging device) of the sensor 21 is positioned at the height at which the exposure surface of the exposure target substrate is supposed to be positioned when the exposure target substrate is mounted on the stage 22. Here, the sensor 21 need only be able to detect the illuminance distribution of light; preferably, a line sensor is used, but a surface sensor may be used instead. However, a line sensor is preferred for use in the direct exposure apparatus because this type of sensor provides a higher resolution than a surface sensor. Specific examples of the point light source and the sensor will be described later.

In the present embodiment, the illuminance distribution of light on the exposure surface equivalent to the exposure target substrate is measured before mounting the exposure target substrate on the stage 22, that is, before starting the exposure of the exposure target substrate. Preferably, data concerning the illuminance distribution thus measured is stored temporarily in a memory (not shown). When performing the measurement, the pattern data necessary for forming the wiring pattern is not input to the DMD 51, but all the micromirrors (not shown) on the DMD 51 are caused to tilt in such a direction that the light emitted from the light source 2 is reflected toward the stage 22. The illuminance distribution detected by the sensor 21 at this time is equivalent to the illuminance distribution of the light falling on the exposure target substrate when performing the exposure with the exposure target substrate mounted on the stage 22.

Figure 3:
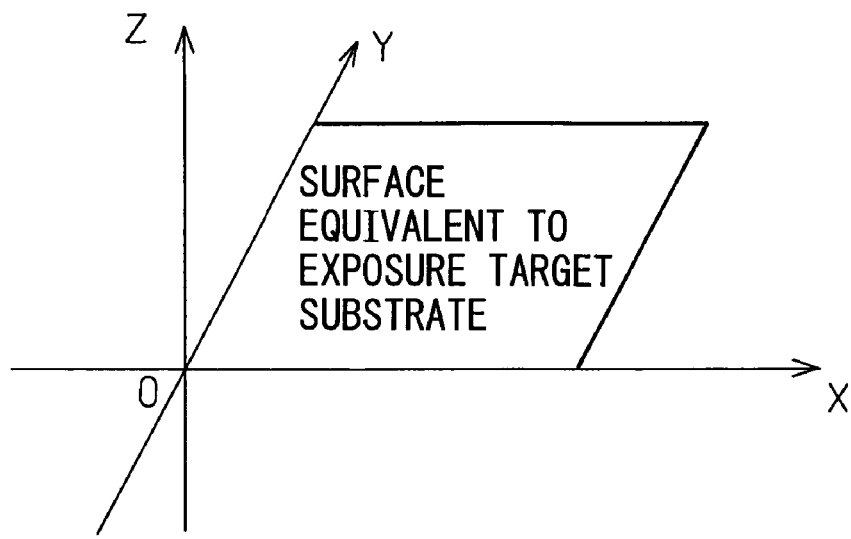
FIG. 3 is a diagram showing coordinate axes that are used for explaining the illuminance distribution of light on an exposure surface equivalent to an exposure target substrate.

This illuminance distribution will be further described below. FIG. 3 is a diagram showing coordinate axes that are used for explaining the illuminance distribution of light on the exposure surface equivalent to the exposure target substrate.

As shown, the exposure surface equivalent to the exposure target substrate, i.e., the surface to be detected by the sensor 21, is plotted on an X-Y coordinate plane, and the intensity of illumination is plotted along the Z axis. The coordinate axes shown in the graphs of FIGS. 4 to 6 below are the same as those defined in FIG. 3.

Figure 4:
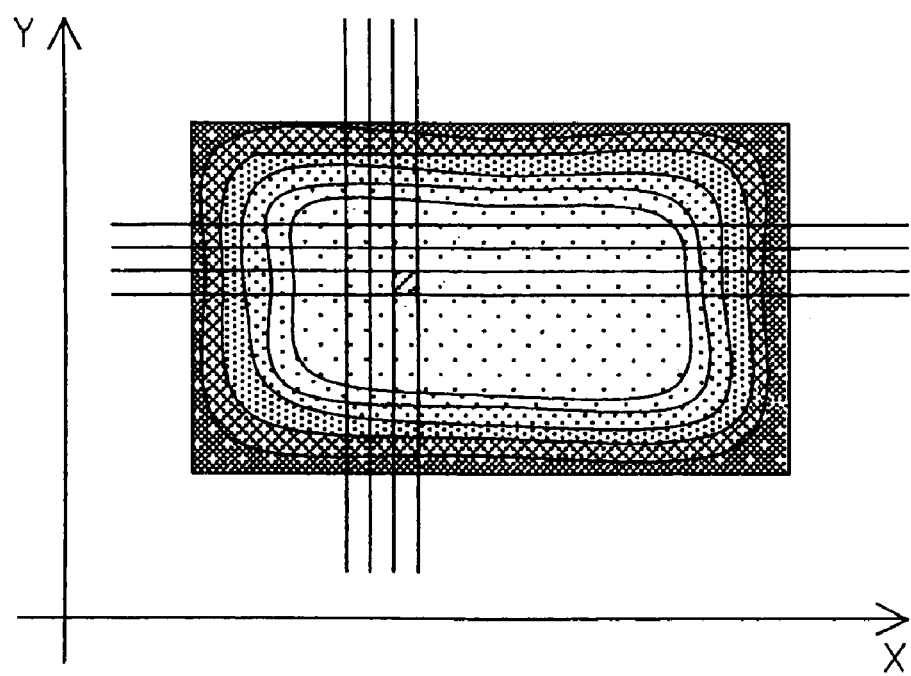
FIG. 4 is a diagram showing the relationship between X and Y coordinates for explaining one example of the illuminance distribution of light on the exposure surface equivalent to the exposure target substrate.
Figure 5:
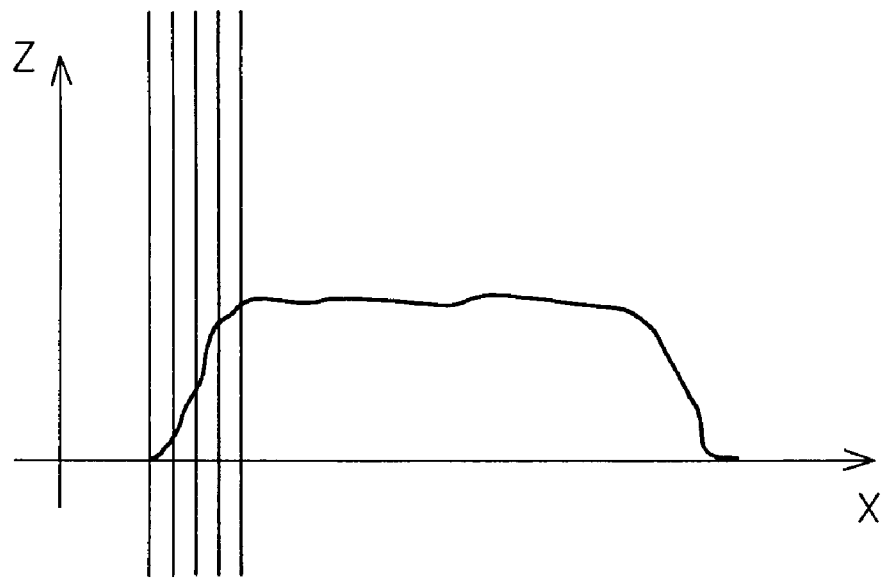
FIG. 5 is a diagram showing the relationship between X and Z coordinates for explaining one example of the illuminance distribution of light on the exposure surface equivalent to the exposure target substrate.

FIGS. 4 and 5 are diagrams showing one example of the illuminance distribution of light on the exposure surface equivalent to the exposure target substrate: FIG. 4 is a diagram showing the relationship between X and Y coordinates, and FIG. 5 is a diagram showing the relationship between X and Z coordinates. As shown in FIG. 4, the intensity of illumination from laser diodes located near the periphery of the light source 2 is weak (shown by solid shading in the figure), while the intensity of illumination from laser diodes located near the center of the light source 2 is strong (shown by stippled shading in the figure). The illuminance (intensity of illumination) distribution is divided in a mesh fashion as shown in FIGS. 4 and 5 (only a portion is shown in FIGS. 4 and 5), and converted into data for each mesh segment. The illuminance data for each mesh segment represents, for example, the average illuminance taken over that mesh segment. From the standpoint of enhancing the controllability of the light output of the light source 2, it is preferable to make the mesh segments substantially correspond one for one with the respective laser diodes in the light source 2.

Based on the illuminance distribution detected by the sensor 21, the control means 12 in FIG. 2 controls the light output of the light source 2 so that the illuminance distribution detected by the sensor 21 becomes uniform. As the light source 2 is constructed by arranging the plurality of laser diodes in a two-dimensional array as earlier described, the control means 12 controls each laser diode in the light source 2 based on the illuminance distribution detected by the sensor 21.

Figure 6:
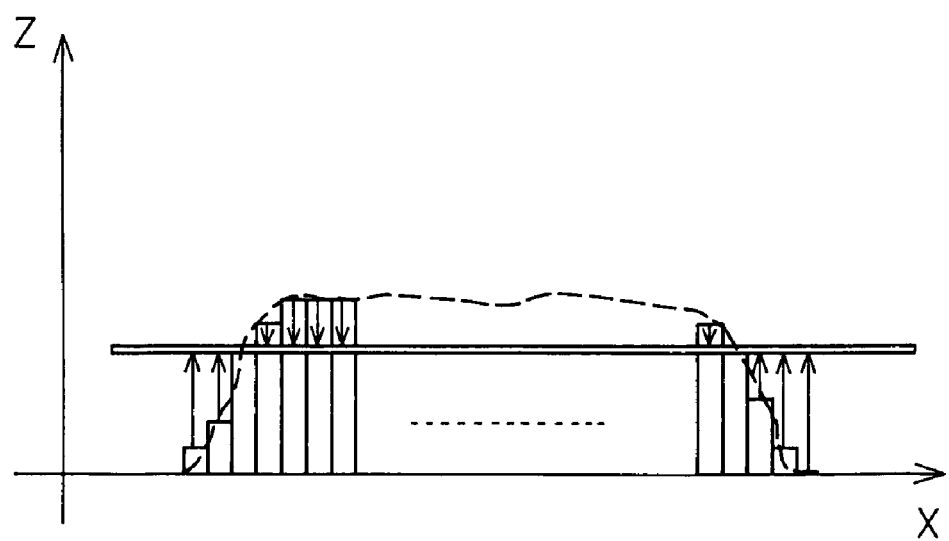
FIG. 6 is a diagram for explaining how the illuminance distribution is made uniform by a control means according to the first embodiment of the present invention.
Figure 7:
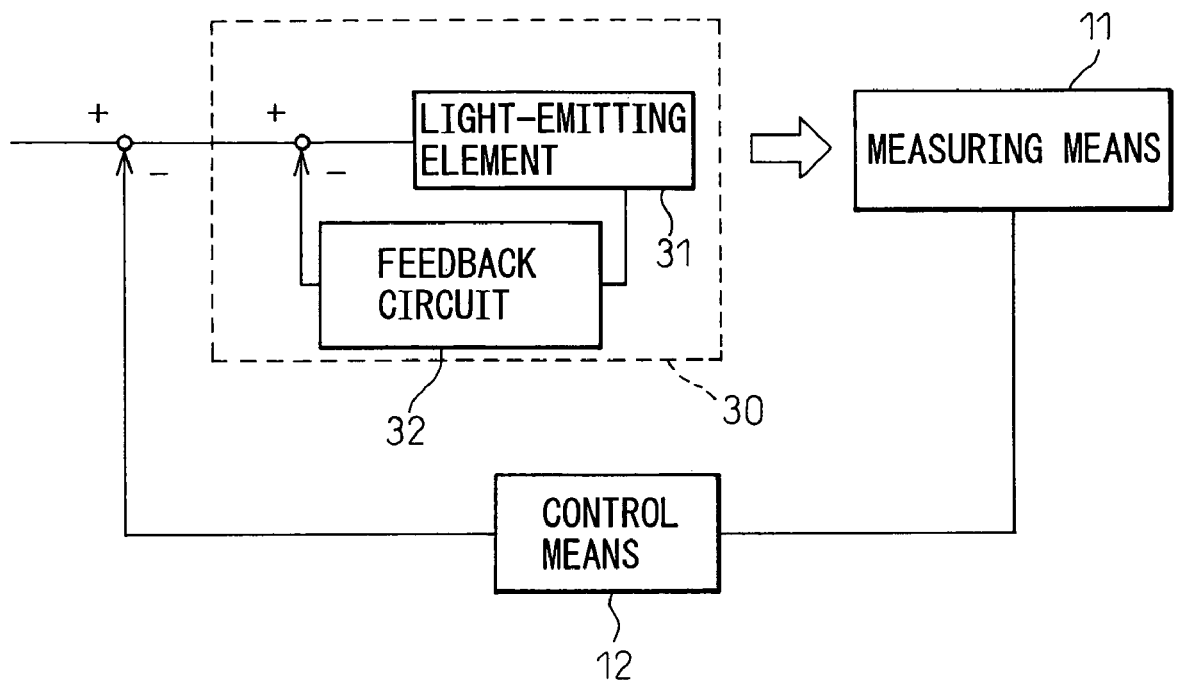
FIG. 7 is a block diagram for explaining feedback control according to the first embodiment of the present invention.

FIG. 6 is a diagram for explaining how the illuminance distribution is made uniform by the control means according to the first embodiment of the present invention. The graph shown here is constructed by superimposing the intended illuminance distribution (shown by a thick line in the figure) on the graph of FIG. 5. FIG. 7 is a block diagram for explaining feedback control according to the first embodiment of the present invention. Like a conventional laser diode, in order to obtain stable light output, each laser diode 30 is provided with a feedback circuit 32 for controlling the intensity of light to be emitted from a light-emitting element 31.

Based on the result of the measurement from the measuring means 11, the control means 12 performs control so that, as shown in FIG. 6, the intensity of light emission is increased for the laser diode 30 in the light source 2 that corresponds to each mesh segment located in the peripheral area where the illuminance is low, while the intensity of light emission is reduced for the laser diode 30 in the light source 2 that corresponds to each mesh segment located in the center area where the illuminance is high. In this way, the illuminance distribution of light on the exposure surface equivalent to the exposure target substrate can be made uniform.

Figure 8A:
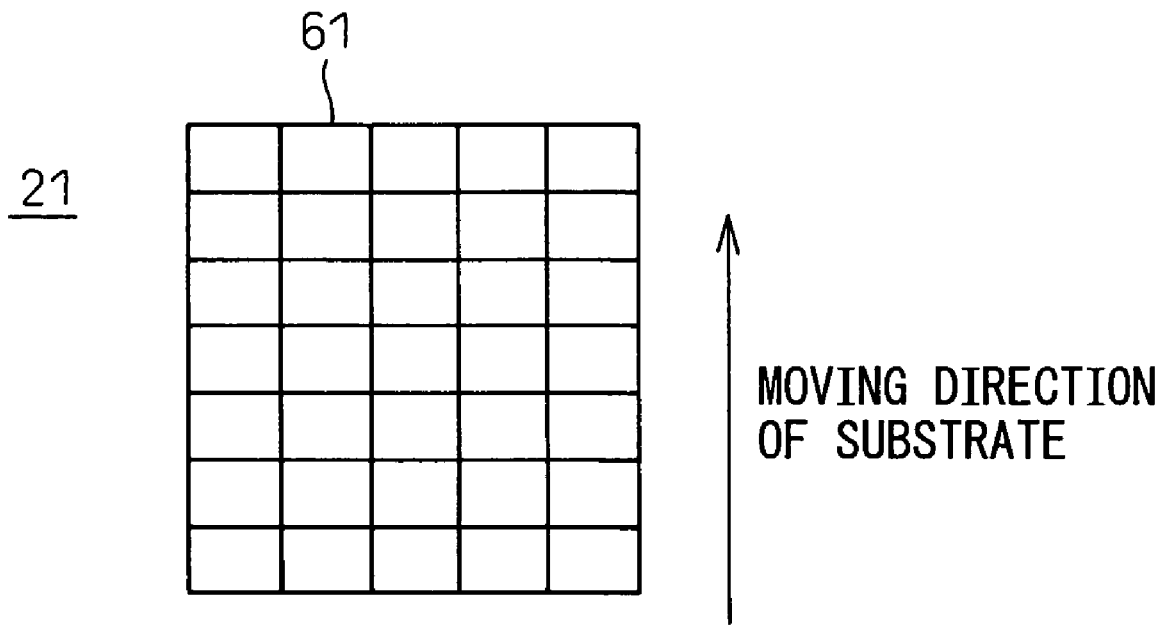
FIGS. 8A and 8B are diagrams for schematically explaining the positional relationship between point light sources and sensor elements.
Figure 8B:
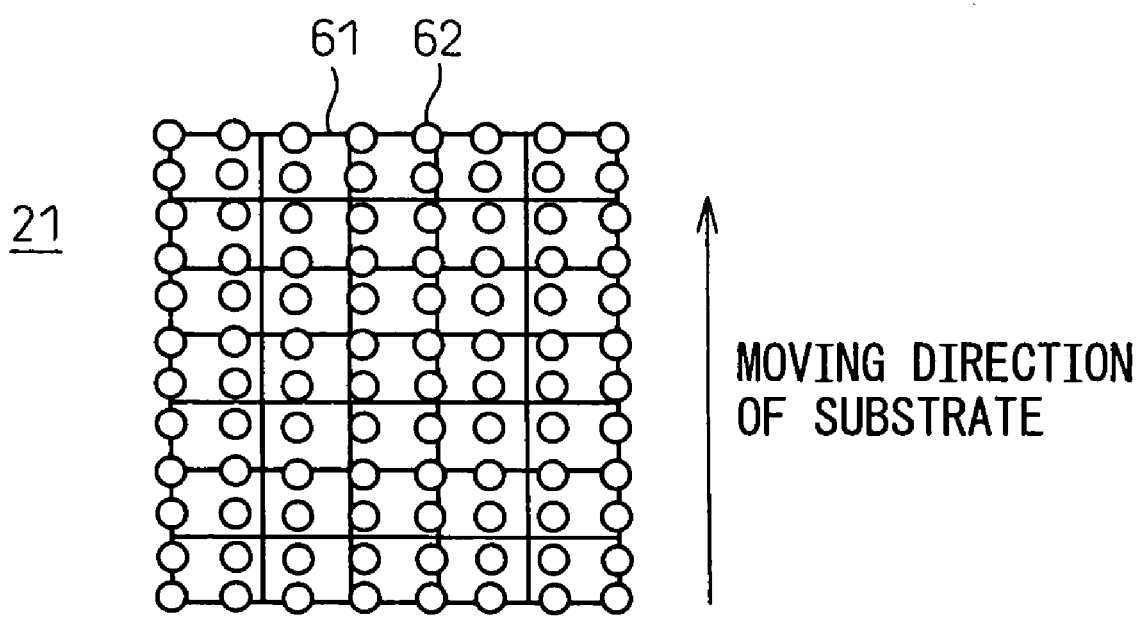

Here, a description will be given of a specific example of the control means 12 according to the first embodiment of the present invention. FIGS. 8A and 8B are diagrams for schematically explaining the positional relationship between the sensor and the point light sources. As shown in FIG. 8A, the sensor 21 is constructed as a sensor array with a plurality of sensor elements 61 arranged in a matrix array. The sensor elements 61 are arranged at equally spaced intervals. Here, it is assumed that each sensor element 61 corresponds to one square in the figure. The light detectable area of one sensor element 61 corresponds to one mesh segment described above. As shown in FIG. 8B, the light source 2 is constructed as a light source array with the plurality of point light sources 62 arranged in a matrix array. The point light sources 62 are arranged, for example, at equally spaced intervals. Here, it is assumed that each point light source corresponds to one circle in the figure. Usually, the illuminance distribution of the light emitted from each point light source 62 exhibits a Gaussian distribution (normal distribution), and the light emitted from a plurality of point light sources 62 can be detected by one sensor element 61. Compared with the sensor elements 61 of the sensor 21 located near the center of the light source array, the amount of light detected by the sensor elements 61 located near the peripheral area of the light source array is small because such sensor elements are less subject to the light from the point light sources.

As previously briefly described with reference to FIG. 2, the illuminance distribution is measured based on the amount of light emitted from the light source 2 and detected by the sensor 21, and the light output of the light source 2 is controlled based on the result of the measurement. In the direct exposure apparatus having point light sources and sensor elements such as described above, the output of each sensor element 61 is connected to an arithmetic processing unit (not shown) in the control means 12. The arithmetic processing unit finds a mathematical relation that holds between the amount of light emitted from each point light source and the amount of light measured by each sensor element and, using this mathematical relation, calculates the target amount of light emission for each point light source in order to achieve the intended illuminance distribution. The control means 12 controls the light output of each point light source so as to achieve the target amount of light emission.

FIG. 9 is a diagram for explaining the arithmetic processing performed within the control means according to the first embodiment of the present invention.

As described above, the light radiated from each point light source in the light source array is detected by a plurality of sensor elements in the matrix sensor array. In the present embodiment, first, with all the sensor elements in the matrix array operating, the point light sources in the light source array are turned on in sequence, one at a time. As each point light source is turned on, its light is detected by several sensor elements; here, if the correspondence between one point light source and the several sensor elements that detect the light emitted from that one point light source is examined for all the point light sources, the correspondence between the amount of light emitted from each point light source and the amount of light measured by each sensor element can be defined by a certain mathematical relation. This mathematical relation is expressed in the form of a matrix such as shown in equation (1) below (this matrix is hereinafter called "matrix A").

$$\begin{pmatrix} s_1 \\ s_2 \\ \vdots \\ s_m \end{pmatrix} = \overbrace{\begin{pmatrix} a_{11} & a_{12} & \cdots & a_{1n} \\ a_{21} & a_{22} & \cdots & a_{2n} \\ \vdots & \vdots & \ddots & \vdots \\ a_{m1} & a_{m2} & \cdots & a_{mn} \end{pmatrix}}^{\text{matrix } A} \begin{pmatrix} d_1 \\ d_2 \\ \vdots \\ d_n \end{pmatrix} \quad (1)$$

Here, n denotes the number of point light sources, and m denotes the number of sensor elements. As the amount of light emitted from one point light source is detected by a plurality of sensor elements, generally the number of point light sources is larger than the number of sensor elements. The smaller number of sensor elements is advantageous from the standpoint of reducing the cost. As an example, n=100 and m=25. In equation (1), $d_1, d_2, \ldots, d_n$ represent the amounts of light emitted from the light sources $D_1, D_2, \ldots, D_n$, respectively, while $s_1, s_2, \ldots, s_n$ represent the amounts of light measured by the sensor elements $S_1, S_2, \ldots, S_n$, respectively.

For example, when only the point light source $D_1$ is turned on, the amounts of light measured by the respective sensor elements $S_1, S_2, \ldots, S_n$ are expressed as $(s_1, s_2, \ldots, s_n) = (a_{11}d_1, a_{21}d_1, \ldots, a_{m1}d_1)$. Likewise, when only the point light source $D_n$ is turned on, for example, the amounts of light measured by the respective sensor elements $S_1, S_2, \ldots, S_n$ are expressed as $(s_1, s_2, \ldots, s_n) = (a_{1n}d_n, a_{2n}d_n, \ldots, a_{mn}d_n)$. To generalize this, when only the point light source $D_i$ (where $1 \leq i \leq n$) is turned on, the amounts of light measured by the respective sensor elements $S_1, S_2, \ldots, S_n$ are expressed as $(s_1, s_2, \ldots, s_n) = (a_{1i}d_i, a_{2i}d_i, \ldots, a_{mi}d_i)$. That is, when only the point light source $D_i$ (where $1 \leq i \leq n$) is turned on, the respective sensor elements $S_1, S_2, \ldots, S_n$ each measure a certain amount of light; here, it can be seen that each element $a_{ji}$ of the matrix A (where $1 \leq j \leq m$) is a parameter that defines the relationship between the amount of light, $d_i$, emitted from the point light source $D_i$ and the amount of light, $s_j$, measured by the sensor element $S_j$. In the present embodiment, based on the result of the measurement supplied from the measuring means when the point light sources are turned on one at a time, a first computing means 71 computes in the form of a matrix the correspondence between the amount of light emitted from each point light source and the amount of light measured by each sensor element. Here, it is preferable that the processing for turning on the point light sources in the light source array in sequence and one at a time, be implemented under computer control.

Based on the matrix A computed by the first computing means 71, a second computing means 72 computes the target amount of light emission for each point light source in order to achieve the intended illuminance distribution. That is, using the matrix A, the target amount of light emission for each point light source is computed from the intended illuminance distribution.

Here, if the matrix A were a square matrix, such a computation of the target amount of light emission would be easy, as the inverse matrix of the matrix A could be obtained. In reality, however, since the number of point light sources is larger than the number of sensor elements, as described above, the matrix A is not a square matrix, and therefore, the inverse matrix of the matrix A cannot be obtained. Accordingly, in the present embodiment, the target amount of light emission is predictively computed by using a process such as that shown in FIG. 10.

Since variations can exist from one sensor element to another and from one point light source to another, if the target amount of light emission is computed by feeding back the result of the measurement of the actual illuminance distribution measured by the sensor elements with all the point light sources turned on simultaneously, then a higher degree of light source control accuracy can be achieved.

Figure 10:
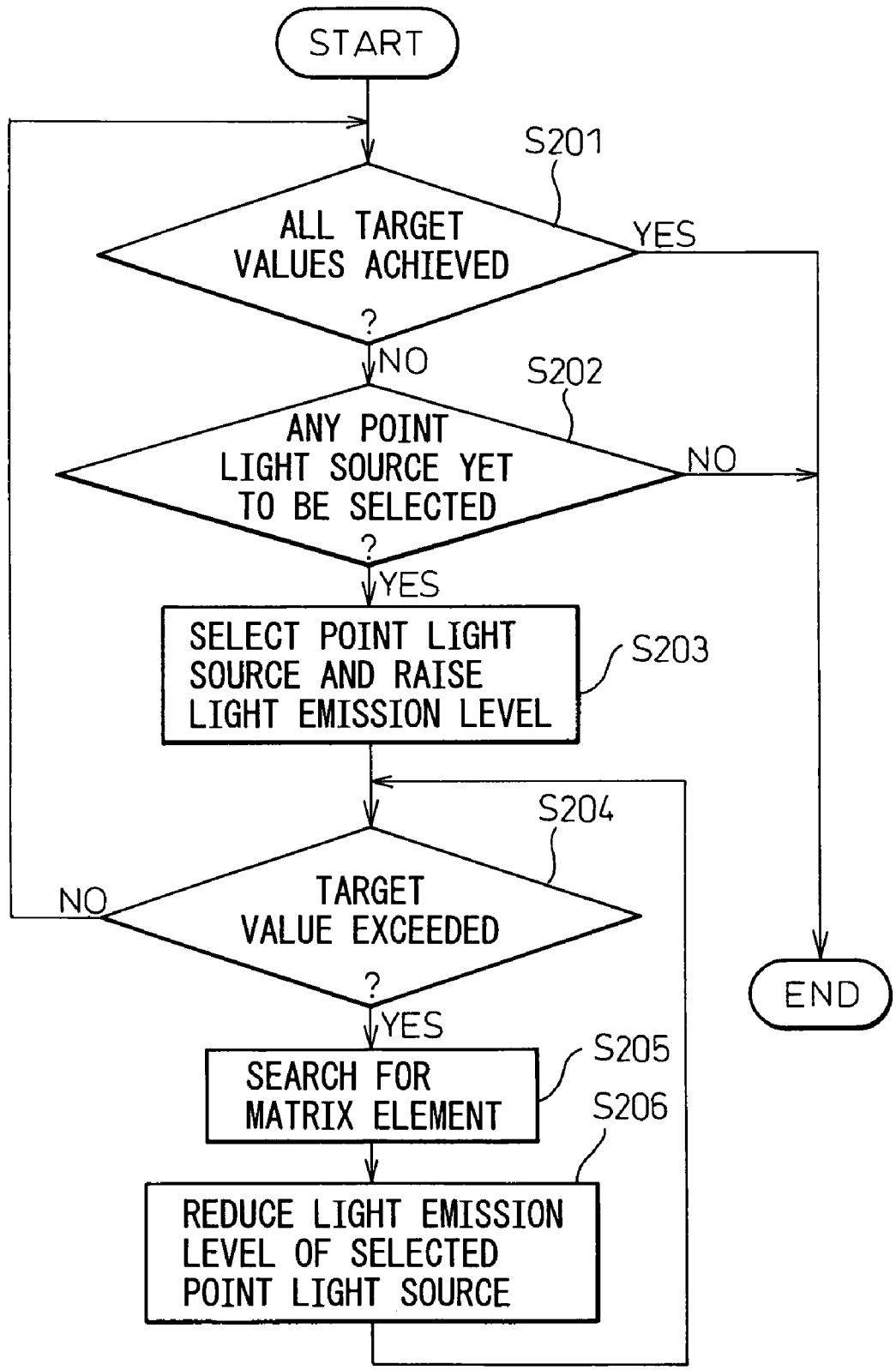
FIG. 10 is a flowchart for explaining how the target amount of light emission is computed by a second computing means in the control means according to the first embodiment of the present invention.

FIG. 10 is a flowchart for explaining how the target amount of light emission is computed by the second computing means in the control means according to the first embodiment of the present invention.

As shown in equation (2), for the matrix A, $s'_1, s'_2, \ldots, s'_n$, denotes the target amounts of light (hereinafter simply referred to as the "target values") in the areas that can be measured by the respective sensor elements $S_1, S_2, \ldots, S_n$, and $d'_1, d'_2, \ldots, d'_n$ denote the target amounts of light emission with which the respective point light sources $D_1, D_2, \ldots, D_n$ can achieve the respective target values $s'_1, s'_2, \ldots, s'_n$. The other parameters are the same as those described in connection with equation (1).

$$\begin{pmatrix} s'_1 \\ s'_2 \\ \vdots \\ s'_m \end{pmatrix} = \overbrace{\begin{pmatrix} a_{11} & a_{12} & \cdots & a_{1n} \\ a_{21} & a_{22} & \cdots & a_{2n} \\ \vdots & \vdots & \ddots & \vdots \\ a_{m1} & a_{m2} & \cdots & a_{mn} \end{pmatrix}}^{\text{matrix } A} \begin{pmatrix} d'_1 \\ d'_2 \\ \vdots \\ d'_n \end{pmatrix} \quad (2)$$

In the present embodiment, the amounts of illumination that could be provided if the respective point light sources $D_1$, $D_2, \ldots, D_n$ were each driven with a certain light emission level are sequentially computed using the matrix A, thereby finding the target amounts of light emission with which the respective point light sources $D_1, D_2, \ldots, D_n$ can achieve the respective target amounts of light. More specifically, one of the point light sources $D_1, D_2, \ldots, D_n$ is selected, and the amounts of light that would be measured by the respective sensor elements $S_1, S_2, \ldots, S_n$ if the light emission level of that selected point light source were raised, for example, by a unit quantity are computed using the matrix A. Then, if any one of the amounts of light thus computed exceeds the corresponding target value, the element of the matrix A that most affects the light source whose light emission level was raised by the unit quantity is found; further, the light source that is expected to affect the thus found element of the matrix A is found, and the light emission level of this light source is reduced. By repeating the above process, the target amounts of light emission with which the respective point light sources $D_1, D_2, \ldots, D_n$ can achieve the respective target amounts of light are found. The process will be described more specifically below.

First, in step S201 of FIG. 10, it is determined whether all the target values have been computed. If all the target values have been computed, the process is terminated.

In step S202, it is determined whether there remains any light source for which the target value has not yet been achieved. If there is no such light source, the process is terminated.

In step S203, one point light source is selected, and the amounts of light that would be measured by the respective sensor elements $S_1, S_2, \ldots, S_n$ if the light emission level of that selected light source were raised by the unit quantity are computed using the matrix A.

Next, in step S204, it is determined whether any one of the amounts of light predictively computed in step S203 exceeds the corresponding target value. If none exceed the respective target values, the process returns to step S201, but if any one of them exceeds the corresponding target value, the process proceeds to step S205.

In step S205, a search is conducted through the elements of the matrix A to find the element of the matrix A that most affects the sensor element that is expected to exceed the target value when the light emission level is raised by the unit quantity.

In step S206, the light source that is expected to affect the element of the matrix A found in step S205 is selected, and the light emission level of this light source is reduced. Here, the amount by which the light emission level is reduced in step S206 may or may not be the same as the unit quantity.

By repeating the above process, the target amounts of light emission for all the point light sources are computed. The control means controls the light output of each point light source so as to achieve the target amount of light emission.

The computation of the target amounts of light emission performed by the second computing means 72 will be described below by using specific numeric values. For simplicity, the following description assumes the use of three point light sources and two sensor elements. The target value for the illuminance level necessary to accomplish exposure is set by considering the properties of the photoresist; in the following description, the target values $s'_1$ and $s'_2$ in the areas that can be measured by the respective sensor elements $S_1$ and $S_2$ are both set to 100 as an example. Further, it is assumed that, when the point light sources $D_1$, $D_2$, and $D_3$ are turned on in sequence and one at a time by driving them with a light emission level 10, the illuminance levels measured by the respective sensor elements $S_1$ and $S_2$ are as shown in the Table of FIG. 11.

From the Table, the matrix A is found as shown in equation (3) below.

$$\begin{pmatrix} s_1 \\ s_2 \end{pmatrix} = \overbrace{\begin{pmatrix} (10/10) & (8/10) & (4/10) \\ (5/10) & (7/10) & (11/10) \end{pmatrix}}^{\text{matrix } A} \times \begin{pmatrix} d_1 \\ d_2 \\ d_3 \end{pmatrix} \quad (3)$$

The amounts of light, $s_1$ and $s_2$, that would be measured by the respective sensor elements $S_1$ and $S_2$ if the light emission level of each of the point light sources $D_1$, $D_2$, and $D_3$ were raised, for example, by a unit quantity "1" are computed using the matrix A. That is, the light emission level is raised by the unit quantity "1" in sequence such that (d1, d2, d3)=(1, 0, 0), (1, 1, 0), (1, 1, 1), (2, 1, 1), (2, 2, 1), (2, 2, 2), (3, 2, 2), (3, 3, 2), (3, 3, 3). During this process, it is determined whether any one of the illuminance levels predictively computed exceeds the target value 100.

If the target value is exceeded when the light emission level of a certain point light source is raised by the unit quantity "1", then the light emission level of that point light source is held fixed, and the light emission levels of other point light sources than that point light source are sequentially raised by the unit quantity "1" in like manner. This process is repeated until there no longer exists any point light source whose light emission level can be raised. In the illustrated example, when the light emission levels of the respective point light sources $D_1$, $D_2$, and $D_3$ become $(d_1, d_2, d_3)$=(44, 44, 43), the illuminance levels predictively computed are $(s_1, s_2)$=(94.6, 100.1).

The element of the matrix A that most affects the illuminance level $s_2$ measured by the sensor element $S_2$ as exceeding the target value 100 is "11/10", i.e., the element located in the second row and third column. The point light source that affects this matrix element is $D_3$. Accordingly, the light emission level of the point light source $D_3$ is reduced by the unit quantity "1". As a result, the light emission levels of the respective point light sources $D_1$, $D_2$, and $D_3$ become $(d_1, d_2, d_3)$=(44, 44, 42).

When the light emission levels of the respective point light sources $D_1$, $D_2$, and $D_3$ become $(d_1, d_2, d_3)$=(44, 44, 42) as shown above, the illuminance levels predictively computed are $(s_1, s_2)$=(96.0, 99.0). From this condition, the above process is repeated once again. That is, the amounts of light, $s_1$ and $s_2$, that would be measured by the respective sensor elements $S_1$ and $S_2$ if the light emission level of each of the point light sources $D_1$, $D_2$, and $D_3$ were raised by the unit quantity "1" are computed, the element of the matrix A that most affects the illuminance level measured by the sensor element as exceeding the target value 100 is found, and the light emission level of the point light source that affects the thus found matrix element is reduced the unit quantity by "1". This process is repeated until the illuminance levels predictively computed settle at respective upper values that do not exceed the target value. In the numerical example shown here, when $(d_1, d_2, d_3) = (49, 43, 41)$, the illuminance levels predictively computed settle at the respective upper values $(s_1, s_2) = (99.8, 99.7)$ that do not exceed the target value. Accordingly, the target amounts of light emission as the light emission levels of the respective point light sources $D_1$, $D_2$, and $D_3$ are given as $(d'_1, d'_2, d'_3) = (49, 43, 41)$. The control means controls the light output of each point light source so as to achieve the target amount of light emission.

When computing the target amount of light emission by feeding back the result of the measurement of the actual illuminance distribution measured by the sensor elements in order to achieve a higher degree of light source control accuracy, the following process is performed. That is, the illuminance levels predictively computed for the light emission levels of the respective point light sources $D_1$, $D_2$, and $D_3$ are compared against the actual illuminance distribution measured by the sensor elements $S_1$, and $S_2$ when the point light sources $D_1$, $D_2$, and $D_3$ are actually driven with the respective light emission levels, and if the result of the comparison shows an error between them, the illuminance levels predictively computed are replaced by the actual illuminance distribution for the current cycle of the process, after which the process is continued.

For example, consider the case where, when the light emission levels of the respective point light sources $D_1$, $D_2$, and $D_3$ are $(d_1, d_2, d_3) = (44, 44, 43)$, the illuminance levels predictively computed are $(s_1, s_2) = (94.6, 100.1)$ but, when the respective point light sources $D_1$, $D_2$, and $D_3$ are actually driven to emit light with the light emission levels of $(d_1, d_2, d_3) = (44, 44, 43)$, the actual illuminance levels measured by the respective sensor elements $S_1$, and $S_2$ are $(s''_1, s''_2) = (100.2, 96.5)$; in this case, the process is performed after changing the illuminance levels used for the process from $(s_1, s_2) = (94.6, 100.1)$ to $(s''_1, s''_2) = (100.2, 96.5)$. As, in this case, the sensor element that exceeds the target value 100 is the sensor element $S_1$, not the sensor element $S_2$, the element of the matrix A that most affects the illumination level $s_1$ measured by the sensor element $S_1$ is "10/10", i.e., the element located in the first row and first column, and the point light source that affects this matrix element is $D_1$. Accordingly, the light emission level of the point light source $D_1$ is reduced by the unit quantity "1". As a result, the light emission levels of the respective point light sources $D_1$, $D_2$, and $D_3$ become $(d_1, d_2, d_3) = (43, 44, 43)$.

By repeating the above process, the target amount of light emission of each point light source can be computed with higher accuracy, achieving high-accuracy light emission control for each point light source.

Figure 12:
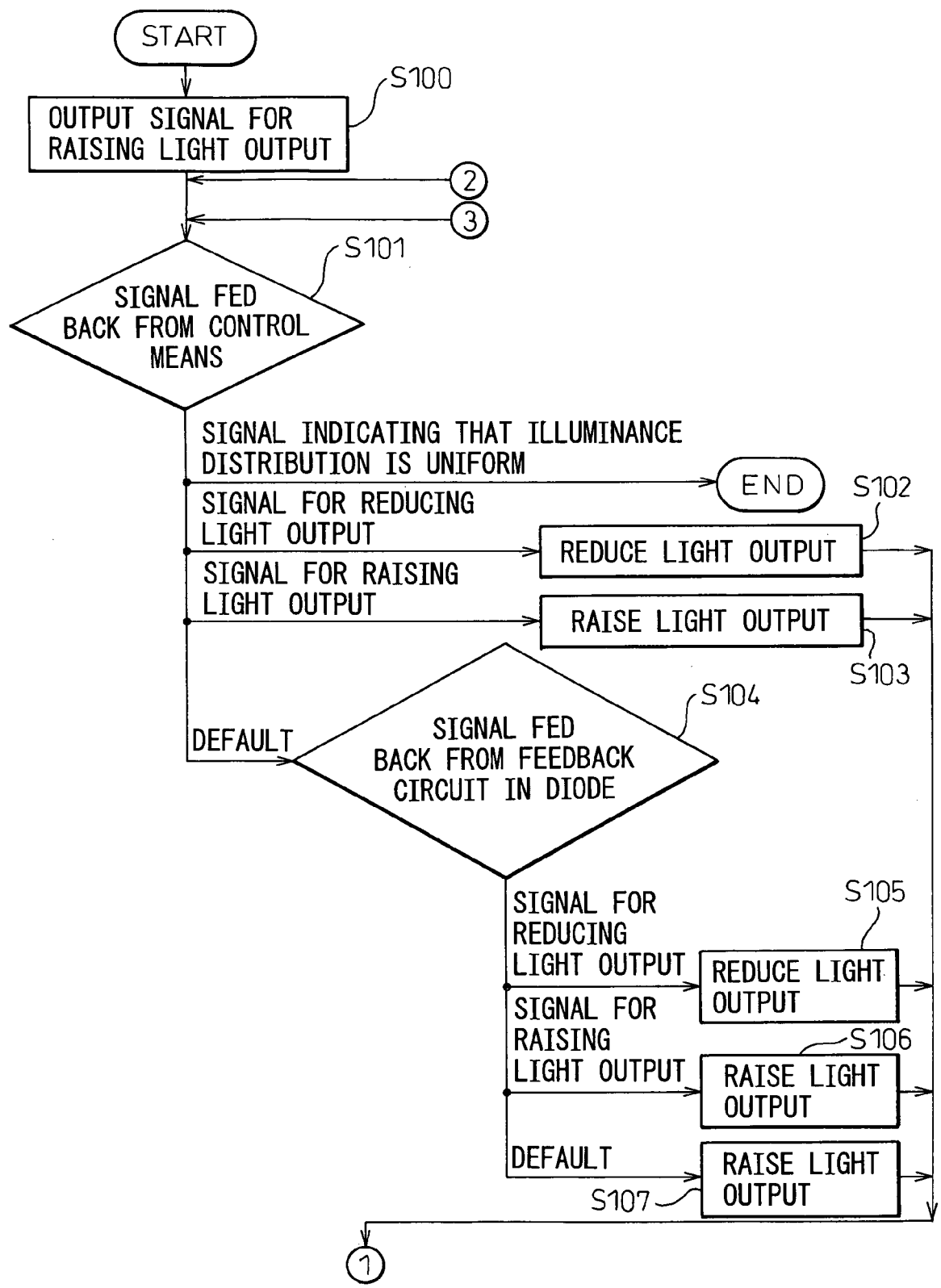
FIG. 12 is a flowchart (part 1) illustrating the operation flow of the direct exposure apparatus shown in FIG. 7.
Figure 13:
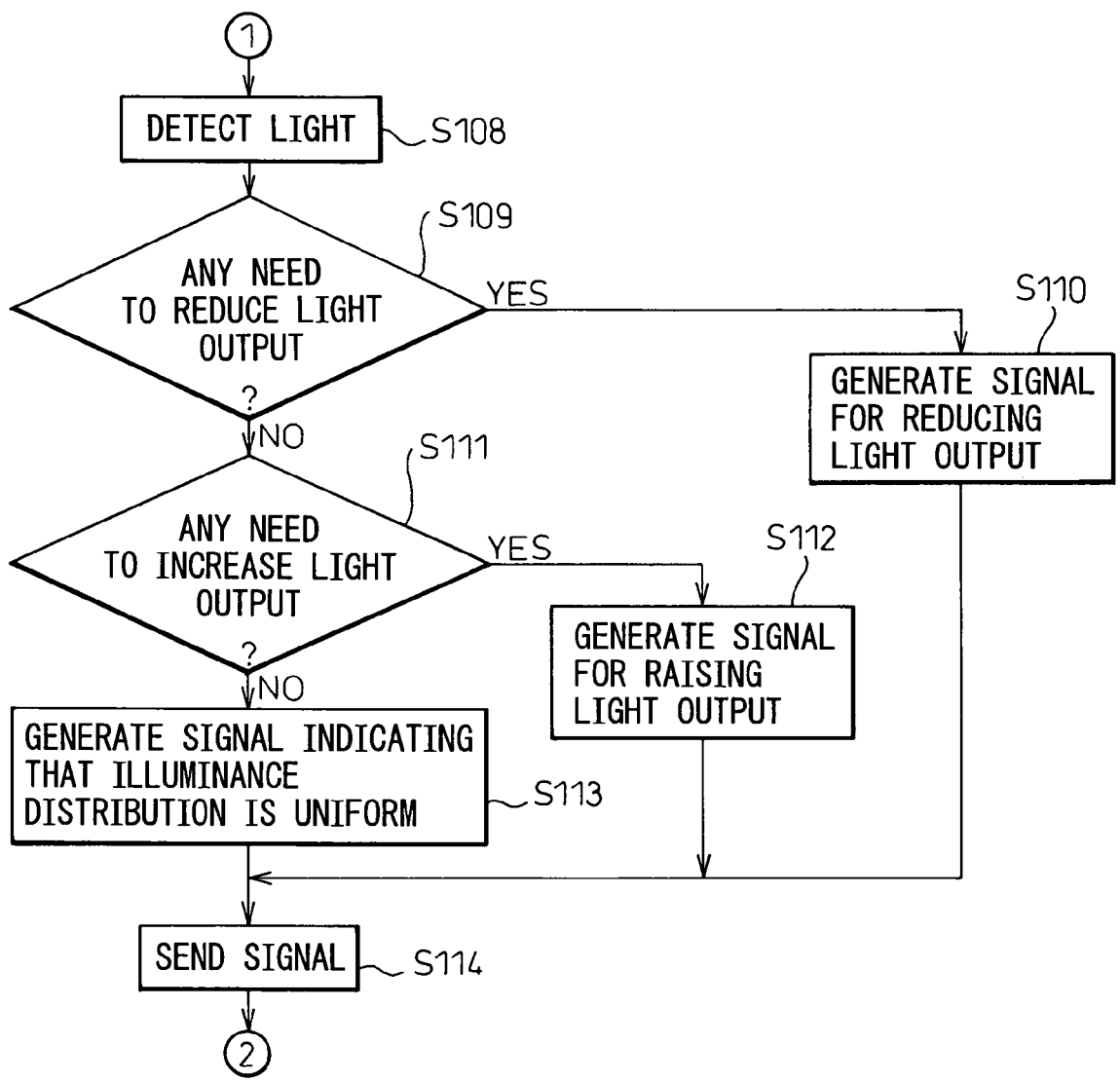
FIG. 13 is a flowchart (part 2) illustrating the operation flow of the direct exposure apparatus shown in FIG. 7.
Figure 14:
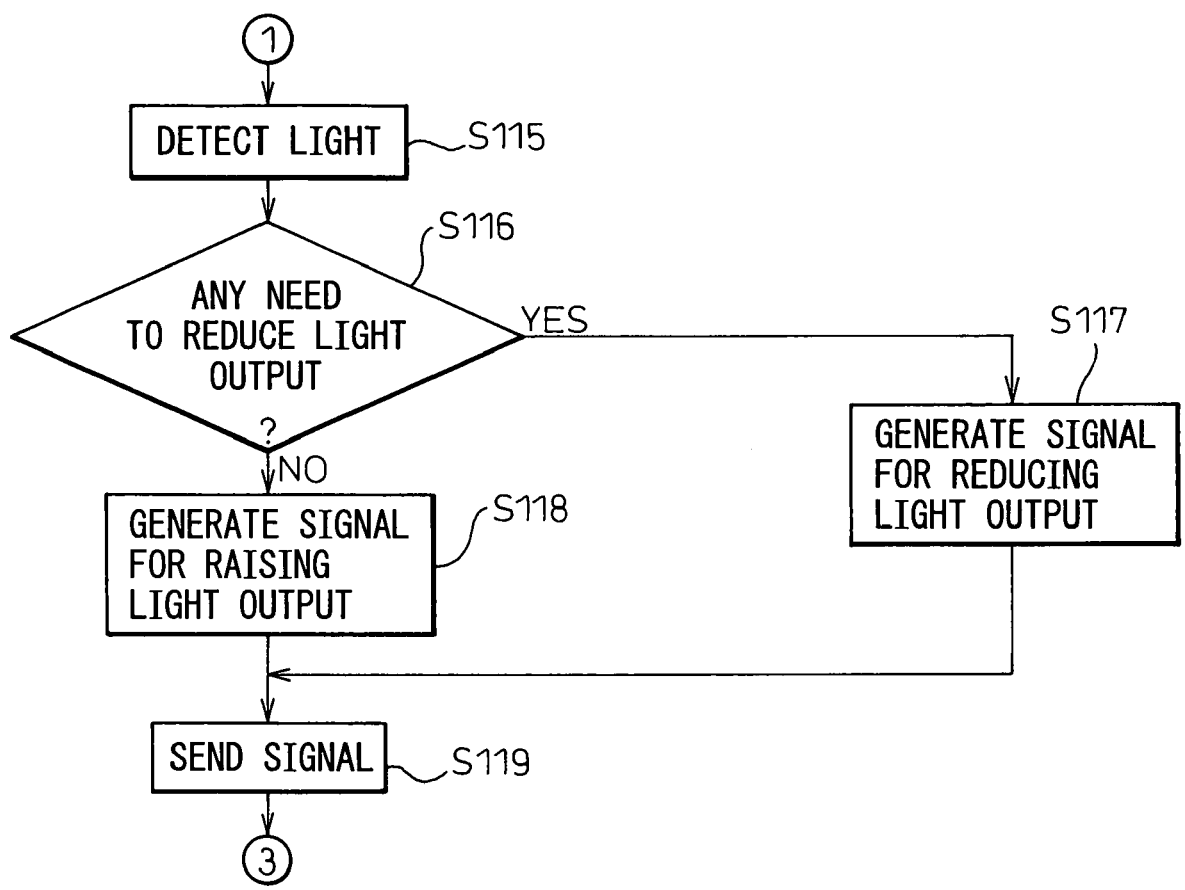
FIG. 14 is a flowchart (part 3) illustrating the operation flow of the direct exposure apparatus shown in FIG. 7.

FIGS. 12 to 14 are flowcharts illustrating the operation flow of the direct exposure apparatus shown in FIG. 7. The process for the control means 12 (shown in FIG. 13) and the process for the feedback circuit 32 in the laser diode 30 (shown in FIG. 14) are operating independently of each other, and the processes shown in FIGS. 13 and 14 are each initiated by causing an interrupt as needed to the main process shown in FIG. 12.

First, in step S100 of FIG. 12, a signal for raising the light output of the laser diode 30 is output. Next, in step S101, the signal fed back from the control means 12 is identified. In the first cycle of the process, there is no fed back signal, that is, it is the default state; therefore, the process proceeds to step S104. In step S104, the signal fed back from the feedback circuit 32 in the laser diode 30 is identified. In the first cycle of the process, there is no fed back signal, that is, it is the default state; therefore, the process proceeds to step S107. In step S107, the output of the laser diode 30 is raised. The light-emitting element 31 of the laser diode 30 thus begins to emit light.

When the light is detected by the measuring means 11 in step S108 of FIG. 13, the control means 12 determines in step S109 whether there is a need to reduce the light output of the laser diode 30. If it is determined in sep S109 that there is a need to reduce the light output, the process proceeds to step S110 where the control means 12 generates a signal for reducing the light output. On the other hand, if it is determined that there is no need to reduce the light output, the process proceeds to step S111 where the control means 12 determines whether there is a need to raise the light output of the laser diode 30. If it is determined in step S111 that there is a need to raise the light output, the process proceeds to step S112 where the control means 12 generates a signal for raising the light output. On the other hand, if it is determined that there is no need to raise the light output, the process proceeds to step S113 to generate a signal indicating that the illuminance distribution is uniform. When the processing in step S110, S112, or S113 is completed, the signal generated in the corresponding step is fed back by the control means 12 (S114), and the process returns to step S101 in FIG. 12.

On the other hand, when the emission of light from the light-emitting element 31 is detected in step S115 of FIG. 14 by a sensor provided in the laser diode 30, then in step S116 it is determined whether there is a need to reduce the light output of the laser diode 30. If it is determined in sep S116 that there is a need to reduce the light output, a signal for reducing the light output is generated in step S117. On the other hand, if it is determined that there is no need to reduce the light output, a signal for raising the light output is generated in step S118. When the processing in step S117 or S118 is completed, the signal generated in the corresponding step is fed back by the feedback circuit 32 (S119), and the process returns to step S101 in FIG. 12.

In step S101, the signal fed back from the control means 12 is identified. If the signal is identified in step S101 as being the signal indicating that the illuminance distribution is uniform, the process is terminated. On the other hand, if the signal is identified in step S101 as being the signal for reducing the light output, the output of the laser diode 30 is reduced in step S102. As a result, the light output of the light-emitting element 31 of the laser diode 30 decreases. On the other hand, if the signal is identified in step S101 as being the signal for raising the light output, the output of the laser diode 30 is raised in step S103. As a result, the light output of the light-emitting element 31 of the laser diode 30 increases.

In step S104, the signal fed back from the feedback circuit 32 is identified. If the signal is identified in step S104 as being the signal for reducing the light output, the output of the laser diode 30 is reduced in step S105. As a result, the light output of the light-emitting element 31 of the laser diode 30 decreases. On the other hand, if the signal is identified in step S104 as being the signal for raising the light output, the output of the laser diode 30 is raised in step S106. As a result, the light output of the light-emitting element 31 of the laser diode 30 increases.

As described above, the process for the control means 12 and the process for the feedback circuit 32 are operating independently of each other, and these processes are each initiated by causing an interrupt as needed to the main process shown in FIG. 12. For example, when the signal from the feedback circuit 32 is fed back earlier than the signal from the control means 12, step S105 or S106 in FIG. 12 is carried out. On the other hand, when the signal from the feedback circuit 32 and the signal from the control means 12 are fed back at the same time, priority is given to the signal fed back from the control means 12, and the signal fed back from the feedback circuit 32 is ignored.

The above process is repeated until a uniform illuminance distribution is achieved.

The above-described process according to the first embodiment of the present invention is performed before mounting the exposure target substrate on the stage, that is, before starting the exposure of the exposure target substrate. For example, the above-described process according to the first embodiment of the present invention should be performed before the exposure target substrate is loaded by a loader onto the stage inside the direct exposure apparatus. Further, the process may be performed each time the exposure target substrate is loaded or every predetermined number of times the exposure target substrate is loaded.

As earlier described, as the intensity of light emitted from each point light source obeys a Gaussian distribution, the intensity of light emission decreases exponentially with the distance from the center of the point light source. Accordingly, in the case of the light source array constructed by arranging the plurality of point light sources in a matrix array, there arises the problem that the illuminance decreases toward the periphery of the light source array as the contributions from adjacent point light sources decrease. The above embodiment solves this problem; however, in addition to the point light source control such as described above, the point light source arrangement itself may be modified as shown below as modified examples in FIGS. 15 and 16.

Figure 15:
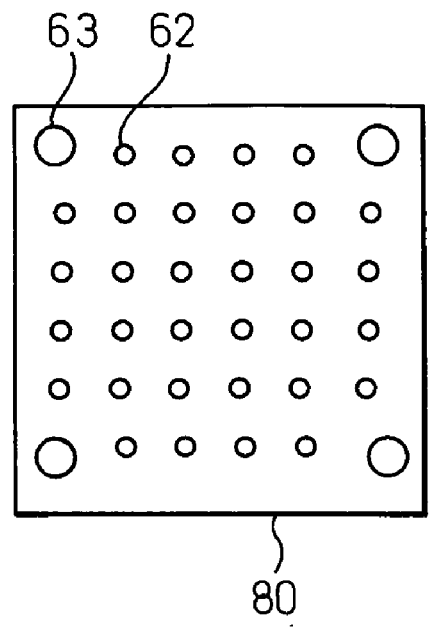
FIG. 15 is a diagram for explaining a first modified example of an arrangement of point light sources in the first embodiment of the present invention.

FIG. 15 is a diagram for explaining a first modified example of the point light source arrangement in the first embodiment of the present invention. This modified example is the same as the first embodiment in that the point light sources are arranged at equally spaced intervals in the light source array 80, but differs in that point light sources 63 having higher luminance than the conventional point light sources 62 are used as the point light sources in the peripheral area of the light source array 80 where the contributions from adjacent point light sources drop, especially, in the four corners of the light source array 80.

Figure 16:
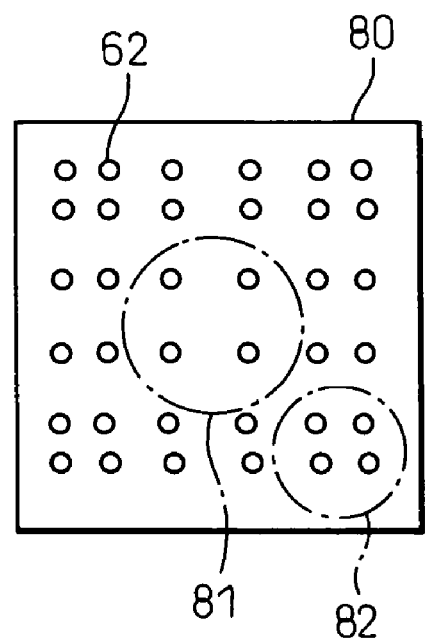
FIG. 16 is a diagram for explaining a second modified example of an arrangement of point light sources in the first embodiment of the present invention.

FIG. 16 is a diagram for explaining a second modified example of the point light source arrangement in the first embodiment of the present invention. In this modified example, the point light sources 62 are arranged at a higher density in the four corners 82 of the light source array 80 than in the center area 81 of the light source array 80.

Figure 17:
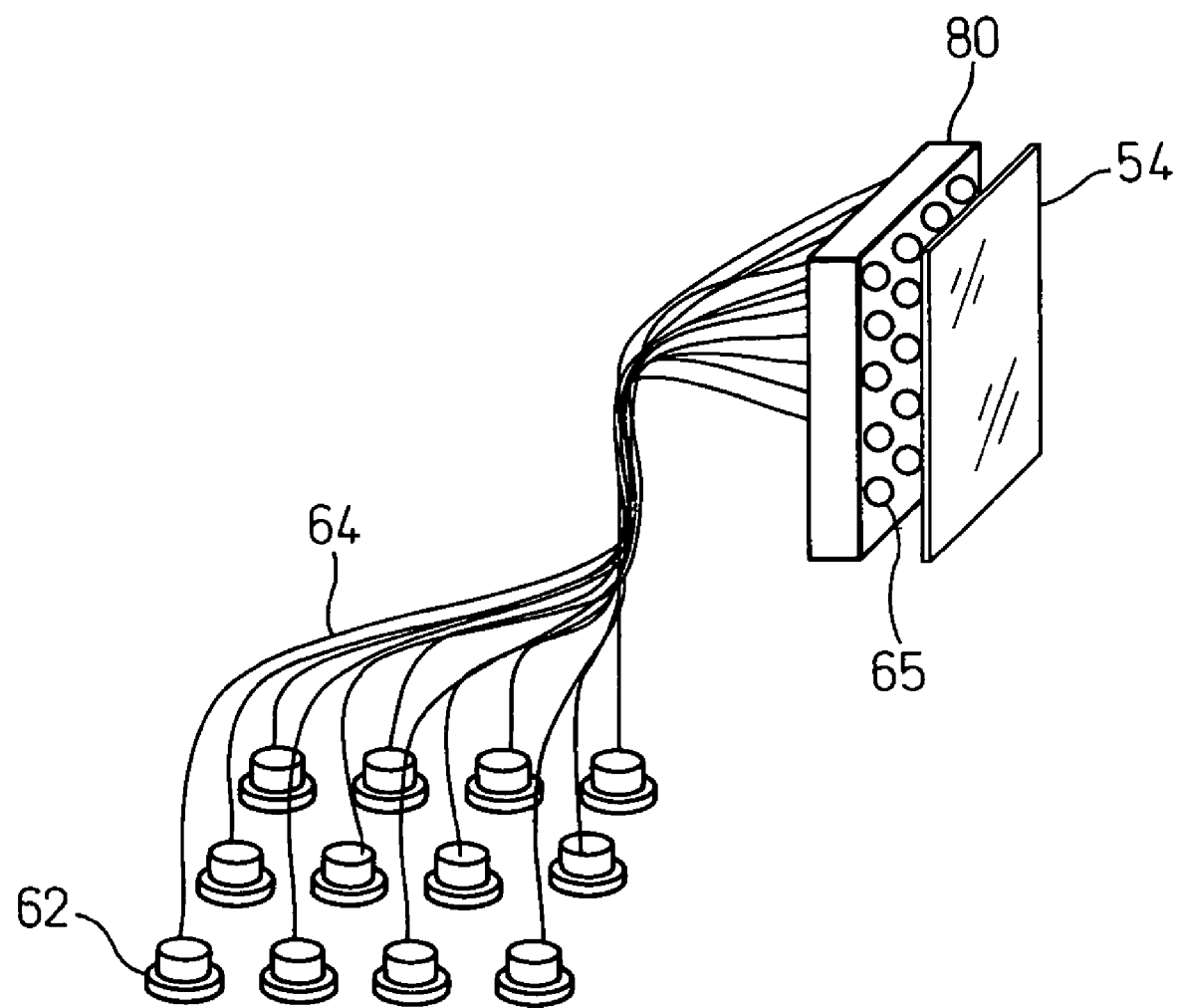
FIG. 17 is a diagram showing a modified example of the configuration of a light source array in the first embodiment of the present invention.

FIG. 17 is a diagram showing a modified example of the configuration of the light source array in the first embodiment of the present invention. When high-luminance point light sources are used, or when the point light sources are arranged at a higher density, as in the above modified examples, there are cases where, because of the size of the point light sources, sufficient spacing cannot be provided with respect to adjacent point light sources. In such cases, the array of the point light sources 62 should be separately provided from the light source array 80, with provisions made to guide the light from each point light source to the light source array 80 by using an optical fiber 64. In the figure, there is also shown the diffusing plate 54 that faces a light-emitting end 65 of each optical fiber 64 in the light source array 80.

Figure 18:
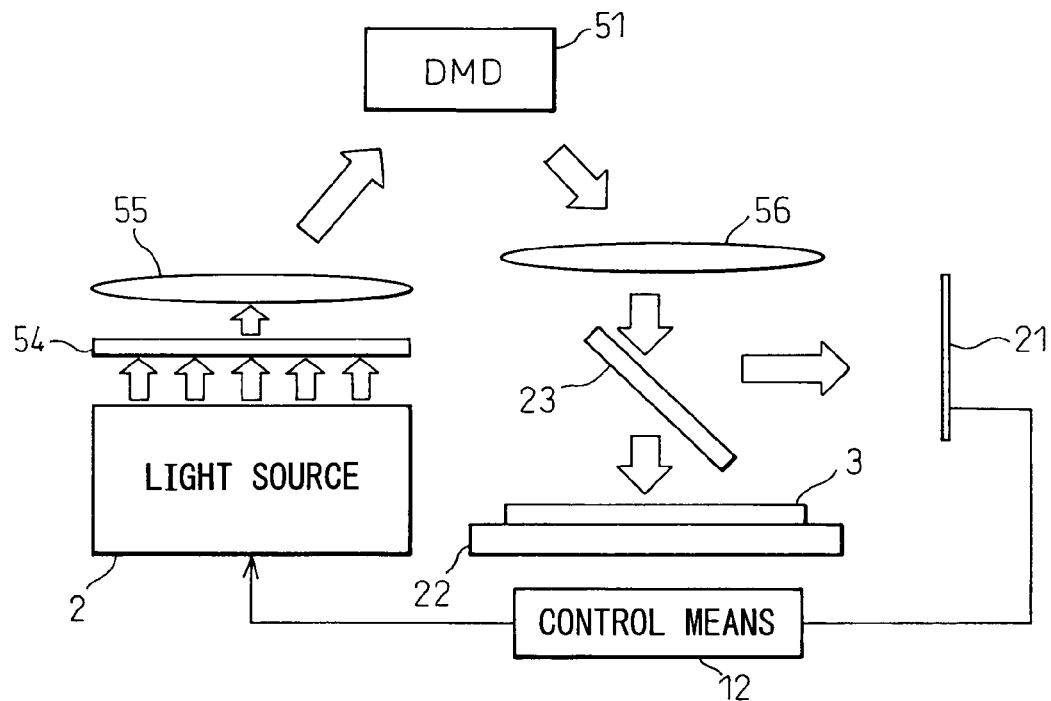
FIG. 18 is a diagram schematically showing the configuration of a direct exposure apparatus according to a second embodiment of the present invention.

FIG. 18 is a diagram schematically showing the configuration of a direct exposure apparatus according to a second embodiment of the present invention.

The process according to the first embodiment of the present invention has been performed before mounting the exposure target substrate on the stage, that is, before starting the exposure of the exposure target substrate. By contrast, the process according to the second embodiment of the present invention is performed during the actual exposure process, and the illuminance distribution of the light falling on the exposure target is measured in real time so that the result of the measurement is immediately reflected in the light source control.

The direct exposure apparatus according to the second embodiment of the present invention includes, as the measuring means 11 described with reference to FIG. 1, a half-silvered mirror 23 for separating a portion of the light projected toward the exposure target substrate 3 during the exposure process and a sensor 21 for measuring the illuminance distribution of that portion of light separated by the half-silvered mirror 23. Here, the sensor 21 need only be able to detect the illuminance distribution of light; preferably, a line sensor is used, but a surface sensor may be used instead. In the present embodiment, as in the first embodiment, the light source 2 is constructed as a surface-area light source by arranging a plurality of laser diodes (not shown) in a two-dimensional array. The stage 22, DMD 51, diffusing plate 54, and lenses 55 and 56 are the same as those described with reference to FIG. 19. In FIG. 18, the position sensor and the pattern generator are omitted.

In the present embodiment, a portion of the light projected toward the exposure target substrate 3 for exposure is separated by the half-silvered mirror. As the illuminance distribution of the thus separated light substantially coincides with the illuminance distribution of the light actually falling on the exposure target substrate, this illuminance distribution is measured by the sensor 21 and the result is fed back by the control means 12 to reflect it in the control of the light source 2. The specific control operations performed here are the same as those described with reference to FIGS. 7 to 10.

According to the second embodiment of the present invention described above, the illuminance distribution occurring during the actual exposure process is predictively computed based on the illuminance distribution of the separated light, and the light source is controlled based on the result of the measurement; therefore, if there occurs unevenness in the illuminance distribution of the light source due to changes in exposure or other conditions during the exposure process, corrections can be applied quickly to make the illuminance distribution uniform. Of course, the illuminance distribution of the light separated by the half-silvered mirror may be measured prior to the exposure process, and the light output of the light source may be controlled based on the result of the measurement.

As a modified example of the second embodiment of the present invention, a mirror may be placed as needed into the light path of the light to be projected onto the exposure target substrate. To achieve this, a light path switching means should be provided that can place the mirror into the light path of the light to be projected onto the exposure target substrate. Further, in this case, provisions may be made so that, prior to the exposure process, the mirror is placed into the light path of the light to be projected onto the exposure target substrate and the illuminance distribution of the light reflected by the mirror is measured to control the light source based on the result of the measurement, and so that, during the exposure process, the mirror is retracted from the light path. In that case, however, the light source cannot be controlled in real time to correct for changes occurring in exposure or other conditions during the exposure process.

As described above, according to the present invention, not only can the light to be projected onto the exposure target substrate be controlled to provide the desired illuminance distribution, but also the intended illuminance distribution can be easily obtained even when exposure conditions are changed. According to the direct exposure, high-precision wiring formation can be accomplished easily and at high speed, and the wiring density can be increased. Accordingly, the present invention is best suited to applications where complicated wiring patterns that require particularly high precision are formed by direct exposure, and the invention can also satisfactorily address the future need for superfine wiring and the resulting increase in the amount of exposure data.

Here, it is to be understood that the present invention is not limited in its application to the control for maintaining the light output of the light source at a constant level, but may also be applied to the control for partially changing the illuminance distribution of the light falling on the exposure target substrate.

Further, in the present invention, the light source has been controlled based on the result of the measurement supplied from the measuring means, but alternatively, a liquid crystal filter may be provided between the light source and the DMD, and the illuminance distribution on the exposure surface equivalent to the exposure target substrate may be controlled by controlling the color density (light transmittance) of the liquid crystal filter based on the result of the measurement supplied from the measuring means.

In the above embodiments and the modified examples, laser diodes, for example, are preferable for use as the point light sources, but LEDs or the like may be used instead. Further, the invention may also be carried out by suitably combining the above embodiments and the modified examples.

What is claimed is:

1. A direct exposure apparatus having a light source for projecting light onto an exposure target, comprising:
   measuring means for measuring an illuminance distribution of light on an area corresponding to an exposure surface of said exposure target; and
   control means for controlling, based on a measurement result supplied from said measuring means, said light source so that an intended illuminance distribution can be obtained,
   wherein said light source has a light source array constructed by arranging a plurality of point light sources in a matrix array, and said measuring means has a sensor array constructed by arranging a plurality of sensor elements in a matrix array,
   wherein said control means comprises:
      first computing means for computing in the form of a matrix a correspondence between the amount of light emitted from each of said point light sources and the amount of light measured by each of said sensor elements, based on the measurement result supplied from said measuring means when said point light sources are turned on in sequence and one at a time; and
      second computing means for computing, based on said matrix, a target amount of light emission for each of said point light sources in order to achieve said intended illuminance distribution, and
   wherein said control means controls each of said point light sources so that said target amount of light emission can be obtained.

2. A direct exposure apparatus as claimed in claim 1, wherein said measuring means includes a sensor for measuring the illuminance distribution of light on an exposure surface equivalent to said exposure target before exposure of said exposure target is started.

3. A direct exposure apparatus as claimed in claim 2, wherein said measuring means further includes a memory for storing data measured by said sensor.

4. A direct exposure apparatus as claimed in claim 1, wherein said measuring means comprises: a half-silvered mirror for separating a portion of the light projected toward said exposure target during exposure; and a sensor for measuring the illuminance distribution of said portion of light separated by said half-silvered mirror.

5. A direct exposure apparatus as claimed in claim 1, wherein said measuring means comprises: a mirror; light path switching means for enabling said mirror to be placed into a light path of the light to be projected onto said exposure target; and a sensor for measuring the illuminance distribution of a portion of the light, said portion of the light being the portion reflected by said mirror when said light is projected toward said exposure target.

6. A direct exposure apparatus as claimed in claim 1, wherein said second computing means computes said target amount of light emission based on said matrix and on the measurement result supplied from said measuring means when all of said point light sources are turned on simultaneously.

7. A direct exposure apparatus as claimed in claim 1, wherein said first computing means derives each element of said matrix based on the amount of light emitted from a designated one of said point light sources when said designated point light source is turned on, and on the amount of light measured by each of said sensor elements when said designated point light source is turned on.

8. A direct exposure method, for exposing an exposure target by projecting light from a light source onto said exposure target, comprising:
   a measuring step for measuring an illuminance distribution of light on an area corresponding to an exposure surface of said exposure target; and
   a control step for controlling, based on a measurement result obtained in said measuring step, said light source so that an intended illuminance distribution can be obtained,
   wherein said light source has a light source array constructed by arranging a plurality of point light sources in a matrix array, and said measuring step measures the illuminance distribution of light by using a sensor array constructed by arranging a plurality of sensor elements in a matrix array,
   wherein said control step comprises:
      a first computing step for computing in the form of a matrix a correspondence between the amount of light emitted from each of said point light sources and the amount of light measured by each of said sensor elements, based on the measurement result obtained in said measuring step when said point light sources are turned on in sequence and one at a time; and
      a second computing step for computing, based on said matrix, a target amount of light emission for each of said point light sources in order to achieve said intended illuminance distribution, and
   wherein said control step controls each of said point light sources so that said target amount of light emission can be obtained.

9. A direct exposure method as claimed in claim 8, wherein said measuring step measures, using a sensor, the illuminance distribution of light on an exposure surface equivalent to said exposure target before exposure of said exposure target is started.

10. A direct exposure method as claimed in claim 9, further comprising a storing step for storing data measured by said sensor.

11. A direct exposure method as claimed in claim 8, wherein said measuring step measures the illuminance distribution of light separated by a half-silvered mirror from the light projected toward said exposure target during exposure.

12. A direct exposure method as claimed in claim 8, wherein said measuring step further includes a light path switching step for enabling a mirror to be placed into a light path of the light to be projected onto said exposure target, and wherein of the light projected toward said exposure target, the illuminance distribution of the light reflected by said mirror is measured.

13. A direct exposure method as claimed in claim 8, wherein said second computing step computes said target amount of light emission based on said matrix and on the measurement result obtained in said measuring step when all of said point light sources are turned on simultaneously.

14. A direct exposure method as claimed in claim 8, wherein said first computing step derives each element of said matrix based on the amount of light emitted from a designated one of said point light sources when said designated point light source is turned on, and on the amount of light measured by each of said sensor elements when said designated point light source is turned on.

* * * * *